(12) United States Patent
Kamo et al.

(10) Patent No.: US 9,476,016 B2
(45) Date of Patent: Oct. 25, 2016

(54) CLEANING SOLUTION, CLEANING FACILITY AND METHOD OF CLEANING MOUNT SUBSTRATE

(71) Applicant: Mitsubishi Electric Corporation, Tokyo (JP)

(72) Inventors: Yoshiyuki Kamo, Nagasaki (JP); Masaru Kinugawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/608,491

(22) Filed: Jan. 29, 2015

(65) Prior Publication Data

US 2015/0299626 A1    Oct. 22, 2015

(30) Foreign Application Priority Data

Apr. 22, 2014   (JP) .................................. 2014-088461

(51) Int. Cl.
| | |
|---|---|
| *B08B 3/04* | (2006.01) |
| *B08B 3/08* | (2006.01) |
| *C11D 7/50* | (2006.01) |
| *C11D 7/32* | (2006.01) |
| *C11D 7/26* | (2006.01) |
| *C11D 3/386* | (2006.01) |
| *C11D 11/00* | (2006.01) |
| *H05K 3/26* | (2006.01) |

(52) U.S. Cl.
CPC ............. *C11D 7/5022* (2013.01); *C11D 3/386* (2013.01); *C11D 7/265* (2013.01); *C11D 7/3209* (2013.01); *C11D 7/3218* (2013.01); *C11D 7/5027* (2013.01); *C11D 11/0047* (2013.01); *H05K 3/26* (2013.01); *H05K 2203/075* (2013.01); *H05K 2203/0789* (2013.01)

(58) Field of Classification Search
CPC .................................. B08B 3/04; B08B 3/08
See application file for complete search history.

(56) References Cited

U.S. PATENT DOCUMENTS

| 5,695,571 A | 12/1997 | Watanabe et al. |
| 6,268,323 B1 * | 7/2001 | Honda ..................... C09D 9/00 510/175 |
| 2006/0281326 A1 | 12/2006 | Ose et al. |
| 2010/0206340 A1 | 8/2010 | Freer et al. |

FOREIGN PATENT DOCUMENTS

| EP | 2708594 A1 | 3/2014 |
| JP | H07-048599 A | 2/1995 |
| JP | 2004-335838 A | 11/2004 |
| JP | 2005-181910 A | 7/2005 |

(Continued)

OTHER PUBLICATIONS

An Office Action issued by the Korean Patent Office on Mar. 10, 2016, which corresponds to Korean Patent Application No. 10-2015-0048135 and is related to U.S. Appl. No. 14/608,491; with English language partial translation.

*Primary Examiner* — Brian P Mruk
(74) *Attorney, Agent, or Firm* — Studebaker & Brackett PC

(57) ABSTRACT

A method of cleaning a mount substrate comprising the step of: preparing a cleaning solution and cleaning the mount substrate by using the cleaning solution. The cleaning solution is a chemical solution produced by providing organic amine as a content in a hydrocarbon-based solvent containing a ketone or an aromatic and by adding unsaturated carboxylic acid anhydride or carboxylic anhydride to this solvent.

5 Claims, 3 Drawing Sheets

(56) References Cited

FOREIGN PATENT DOCUMENTS

| JP | 2007-254555 A | 10/2007 |
| JP | 2003-027091 A | 12/2007 |
| JP | 2003-073699 A | 6/2010 |
| JP | 2010-138271 A | 6/2010 |
| KR | 2013-0112847 A | 10/2013 |
| KR | 2014-0037772 A | 3/2014 |

* cited by examiner

Fig. 6

| CHEMICAL SOLUTION FOR CLEANING | STAINS/DISCOLORATIONS | WIRE BONDABILITY |
|---|---|---|
| COMMERCIALLY AVAILABLE SOLVENT A | OCCUR | 3 |
| COMMERCIALLY AVAILABLE SOLVENT B | OCCUR | 2 |
| SOLVENT C (A+2%X) | NOT OCCUR | 4 |
| SOLVENT D (A+0.05%X) | OCCUR | 3 |
| SOLVENT E (A+2%Y) | NOT OCCUR | 4 |
| SOLVENT F (A+X+Y) | NOT OCCUR | 4 |
| SOLVENT F (WITH ULTRASONIC WAVE) | NOT OCCUR | 5 |
| SOLVENT G (A+0.1%X) | NOT OCCUR | 3 |
| SOLVENT H (A+2%Y2) | NOT OCCUR | 4 |

CLEANING SOLUTION, CLEANING FACILITY AND METHOD OF CLEANING MOUNT SUBSTRATE

BACKGROUND OF THE INVENTION

1. Field of the Invention

The present invention relates to a cleaning solution, a cleaning facility and a method of cleaning a mount substrate.

2. Background Art

A cleaning method for removing a flux residue after soldering, as disclosed in Japanese Patent Laid-Open No. 2003-73699 for example, is known. Conventionally, a solvent prepared by adding glycol ether to a ketone/aromatic solvent provided as a base solvent to improve the cleaning effect is used as a hydrocarbon-based solvent for cleaning on flux on a mount substrate.

In recent years, lead-free solder pastes, halogen-free solder pastes and the like have been used as environmental-friendly solder pastes. Also, with the reduction in chip size, powdered solder has been used. With these new solders, there is a problem that a stain or a discoloration is caused as a result of cleaning based on the conventional art. There is also a problem that a junction failure such as wire bonding failure in a post-process or a fault such as separation of an encapsulation material occurs.

SUMMARY OF THE INVENTION

In view of the above-described problems, an object of the present invention is to provide a cleaning solution, a cleaning facility and a mount substrate cleaning method capable of performing high-quality cleaning even on an object soldered with a new solder such as lead-free solder is used.

According to one aspect of the present invention, a method of cleaning a mount substrate comprising the step of: preparing a cleaning solution and cleaning the mount substrate by using the cleaning solution. The cleaning solution is a chemical solution produced by providing organic amine as a content in a hydrocarbon-based solvent containing at least one of a ketone, an aromatic, or a ketone and an aromatic, and by adding at least one of unsaturated carboxylic acid anhydride, carboxylic anhydride, or unsaturated carboxylic acid anhydride and carboxylic anhydride to this solvent.

According to another aspect of the present invention, a cleaning solution is produced by providing organic amine as a content in a hydrocarbon-based solvent containing at least one of a ketone, an aromatic, or a ketone and an aromatic, and by adding at least one of unsaturated carboxylic acid anhydride, carboxylic anhydride, or unsaturated carboxylic acid anhydride and carboxylic anhydride to this solvent.

According to further another aspect of the present invention, a cleaning facility includes: a cleaning tank in which a cleaning solution is stored; a rinsing liquid tank in which a rinsing liquid is stored; and a drying tank. The cleaning solution is produced by providing organic amine as a content in a hydrocarbon-based solvent containing at least one of a ketone, an aromatic, or a ketone and an aromatic, and by adding at least one of unsaturated carboxylic acid anhydride, carboxylic anhydride, or unsaturated carboxylic acid anhydride and carboxylic anhydride to this solvent.

Other and further objects, features and advantages of the invention will appear more fully from the following description.

BRIEF DESCRIPTION OF THE DRAWINGS

FIG. 6 is a table containing results of an experiment performed by the inventor of the present invention.

DETAILED DESCRIPTION OF THE PREFERRED EMBODIMENTS

Figure 1:
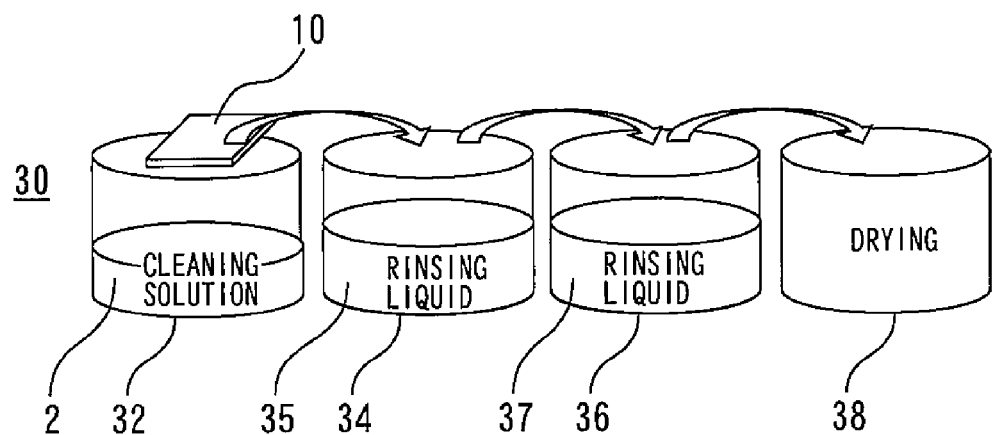
FIG. 1 is a diagram showing a cleaning solution, a cleaning facility and a mount substrate cleaning method according to an embodiment of the present invention.
Figure 2:
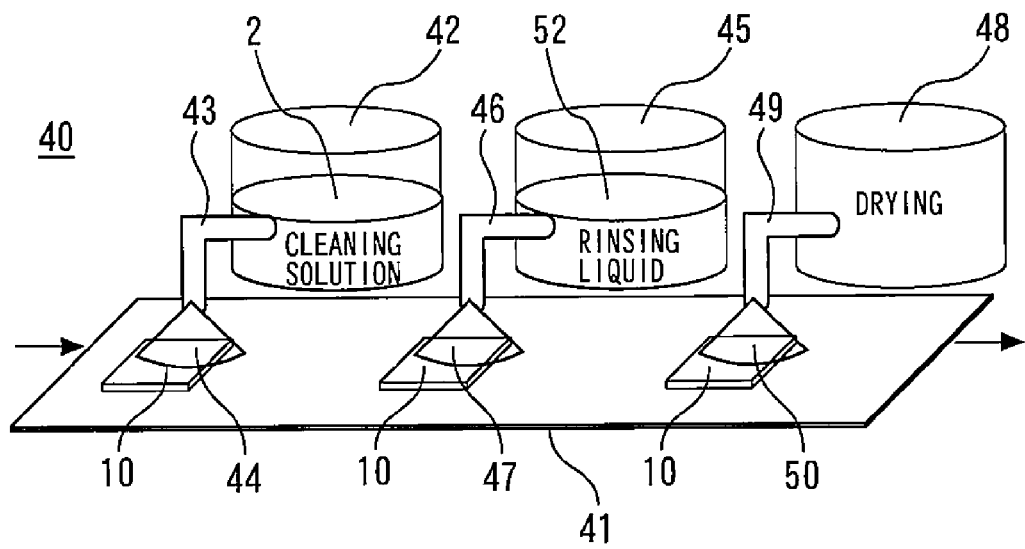
FIG. 2 is a diagram showing another cleaning solution, another cleaning facility and another mount substrate cleaning method according to the embodiment of the present invention.

FIGS. 1 and 2 are diagrams each showing a cleaning solution, a cleaning facility and a mount substrate cleaning method according to an embodiment of the present invention. FIG. 1 shows batch cleaning, while FIG. 2 shows continuous-processing cleaning. The cleaning processing method of the present invention is not limited to any concrete one. In a preferred embodiment of the present invention, however, a method of batch cleaning using ultrasound or a jet, or a method of continuous cleaning with a shower-type apparatus as shown in FIG. 2 may be adopted.

A cleaning facility 30 shown in FIG. 1 is provided with a cleaning tank 32 in which a cleaning solution 2 is stored and ultrasound cleaning or jet cleaning can be performed to produce an improved cleaning effect, a rinsing liquid tank 34 in which a first rinsing liquid 35 is stored, a rinsing liquid tank 36 in which a second rinsing liquid 37 is stored, and a drying tank 38 in which a mount substrate 10 after cleaning can be dried. The mount substrate 10 is immersed in one after another of the cleaning tank 32 and the rinsing liquid tanks 34 and 36 in this order and is dried in the drying tank 38.

A cleaning facility 40 shown in FIG. 2 is provided with a movable conveyor 41 on which a mount substrate 10 is placed, a cleaning tank 42, a rinsing liquid tank 45, and a drying tank 48 having a jetting portion 49 from which dry air 50 is jetted. The cleaning tank 42 stores the cleaning solution 2 and is capable of jetting the cleaning solution 2 in the form of a spray 44 from the jetting portion 43 to the mount substrate 10 on the movable conveyor 41. The rinsing liquid tank 45 stores a rinsing liquid 52 and is capable of jetting the rinsing liquid 52 in the form of a spray 47 from a jetting portion 46 to the mount substrate 10 on the movable conveyor 41.

The mount substrate 10 is cleaned with the cleaning solution 2 by using the thus-arranged cleaning facility 30 or 40. The cleaning solution 2 is a chemical solution prepared by providing a secondary or tertiary organic amine as a content in a hydrocarbon-based solvent containing a ketone or an aromatic and by adding unsaturated carboxylic acid anhydride or carboxylic anhydride to this solvent. More specifically, the organic amine contains at least one of amines including diethanolamine or trimethylamine, which are secondary and tertiary amines. The cleaning solution 2 contains at least one of anhydrous unsaturated carboxylic acid compounds (such as abietic anhydride and neoabietic anhydride) and anhydrous dicarboxylic acids (such as formic acid, acetic anhydride and valeric anhydride). The amine component is equal to or smaller than the equivalent to the carboxylic acid species. A semiconductor element or an electronic component is mounted on the mount substrate 10 by soldering. On flux after mounting, for example, cleaning is performed at a solution temperature of 40° C. for 10 minutes.

A ketone or an aromatic serves for cleaning by dissolving a rosin component (mainly abietate), which is a flux residue. However, there is a possibility of a stain (discoloration) or a wire bonding failure being caused by absorption of water into the flux residue or chemical reaction between the flux residue and a patterned base. In the present embodiment, therefore, an anhydrous unsaturated carboxylic acid compound having a reducing action (such as abietic acid or neoabietic acid) or anhydrous dicarboxylic acid (such as acetic anhydride or valeric anhydride) is added. The effect with abietic acid was confirmed. An anhydrous unsaturated carboxylic acid compound such as neoabietic acid has the same reducing action and is capable of producing the same effect. An experiment using acetic anhydride in the same way as described above was performed to confirm the effect. However, the same effect can also be obtained with other carboxylic anhydrides.

Small amounts of cleaning residues attached to a wiring pattern, plating, a solder resist (SR) on the mount substrate 10 are removed and no such defect in appearance as a stain or a discoloration is caused. Also, since residues on bonding pad portions with bonding joints are removed, no junction failure occurs. Further, the product does not degrade during operation and has improved reliability since no contaminant exists as a cause of corrosion. The present invention can be applied to well-known various mount substrates 10. However, the present invention is effective particularly in cleaning a mount substrate 10 requiring a high cleaning effect in a case where a lead-free solder paste, a halogen-free solder paste or powdered solder is used.

Figure 3:
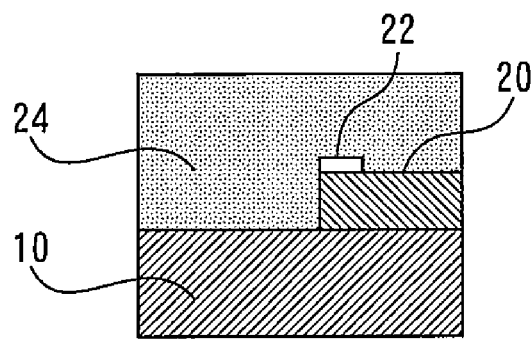
FIG. 3 is a diagram showing a state where a residue causes separation of an encapsulation resin.
Figure 4:
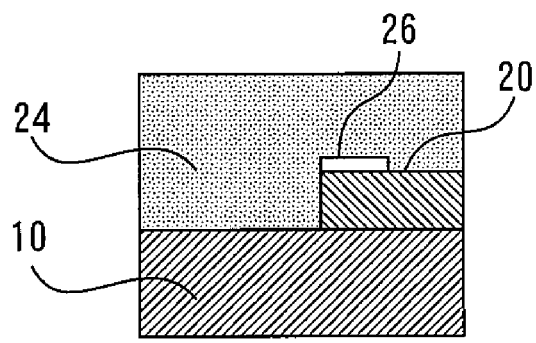
FIG. 4 is another diagram showing the state where the residue causes separation of the encapsulation resin.
Figure 5:
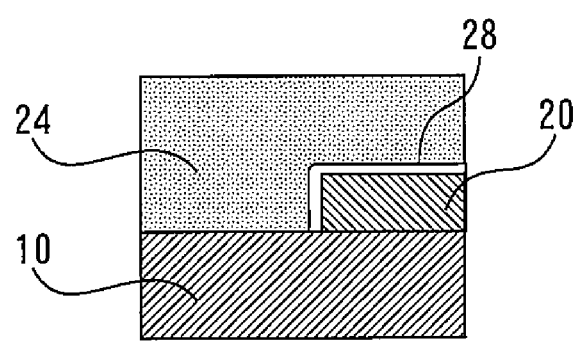
FIG. 5 is still another diagram showing the state where the residue causes separation of the encapsulation resin.

As another effect of the present invention, an improvement in reliability as a result of an improvement in intimacy of contact at the time of resin encapsulation in a post-process achieved by removing residues derived from flux may also be mentioned. FIGS. 3 to 5 are diagrams showing a state where a residue 22 causes separation of an encapsulation resin 24. If the amount of contamination is large, the intimacy of contact between the encapsulation resin 24 and the base material (wiring pattern 20 in this case) is reduced. In a case where the residue 22 exists on the wiring pattern 20 on the mount substrate 10 as shown in FIG. 3, a separation starting point 26 occurs, as shown in FIG. 4, and separation starts from this point. As a result of the progress of separation, separation 28 occurs, as shown in FIG. 5. In the present embodiment, such separation can be prevented.

FIG. 6 is a table showing a list of results of an experiment performed by the inventor. The inventor of the present invention examined causes of faults and made clear that a small amount of a residue consisting of a metal oxide or a hydroxide derived from flux remains on the surface after cleaning and acts as a cause of a stain or a discoloration or a cause of degradation of wire bondability in a post-process. The inventor also made clear that the solvents conventionally used are formed mainly of nonpolar solvents and therefore have a low ability to remove residues having a polarity or polar compounds such as metal oxides (or hydroxides) and allow small amounts of residues to remain. The inventor further studied to find that the cleaning effect can be improved by providing carboxylic anhydride as a content in the cleaning solution 2 and the above-described problems can be solved thereby. The solvent of the present invention was selected because if an anhydrous carboxylic acid compound exists in the solvent, it has a reducing action on metal oxides (or hydroxides), and because an anhydrous carboxylic acid compound is also contained in solder flux and can easily be provided.

A mount substrate 10 on which a first solder paste formed of powdered solder having a central grain size of 32 μm or a second solder paste having a central grain size of 21 μm was applied was prepared as a specimen. The first and second solder pastes are commercially available articles. As a comparative chemical solution for cleaning, a commercially available article A or B (a ketone/aromatic mixture solution) was used. As a solvent C, a solvent prepared by adding 3% diethanolamine and 2% abietic anhydride (component X) to the commercially available article A was used. As a solvent D, a solvent prepared by adding 1% triethanolamine and 0.05% abietic anhydride to the commercially available article A was used. As a solvent E, a solvent prepared by adding 3% diethanolamine and 2% dicarboxylic anhydride (component Y) to the commercially available article A was used. The upper limit of the content of abietic anhydride or dicarboxylic anhydride was set to 5% because a content of the anhydride exceeding 5% was not fully dissolved. As anhydrous dicarboxylic acid Y, acetic anhydride was used in this experiment. A solvent F had 1% X and 1% Y added thereto, a solvent G had 0.1% X added thereto, and a solvent H had 2% formic acid added thereto as a component Y2.

An organic amine such as diethanolamine or trimethylamine, which is a secondary or tertiary amine, is added as the above-mentioned reaction accelerator and has a function to prevent oxidation of the solution due to moisture adsorption to carboxylic acid. In the embodiment, the cleaning solution 2 was adjusted immediately before the experiment. In the case of an application to manufacturing, however, one prepared in advance and stored may be used. However, if the condition of storage is bad, the amine component is consumed during storage. In such a case, addition of the amine component immediately before cleaning is effective in accurately controlling the amount of the amine component. The solution has a characteristic with respect to the added amine component such that damage to the cleaned object is smaller when a secondary or tertiary amine having lower reactivity is added than when a primary amine having higher reactivity is added. For example, if the cleaned object is a metal pattern and member formed of copper or tin for example, there is a possibility of the metal portion being corroded.

The cleaning method was such that each solvent was maintained at 30 to 60° C. and the specimen was immersed for about 5 to 15 minutes. After cleaning, the solution was rinsed off with a suitable solvent such as alcohol, and the specimen was thereafter dried with hot air to be obtained as a sample. The surface of the sample was visually observed through a 10× magnifying glass to check whether or not there was a stain. Also, wiring bonding was performed on a bonding pad and the strength of intimate contact was evaluated with respect to the junction area by a tensile test.

It was confirmed that, as shown in table form in FIG. 6, a stain unremovable with a solvent in a single state or the occurrence of a wire bonding failure was reduced by adding the above-described substances. It was also confirmed that the intimacy of contact when resin encapsulation was performed as a post-process was improved with the improvement in cleaning performance. The commercially available articles A and B are hydrocarbon-based cleaning agents. Stains/discolorations were visually checked by using the magnifying glass. Wire bondability is wire bonding joinability. The tensile strength and the peeling strength were checked after bonding and strength indications in five levels were made with respect to the junction area. Level 0 was assumed to indicate no junction (intimate contact) and level 5 was assumed to indicate the case where the wire itself broke before peeling. Similar tendencies, though differing in degree, were observed with respect to the different solder pastes.

The features and advantages of the present invention may be summarized as follows. According to the present invention, cleaning is performed by using a chemical solution to which unsaturated carboxylic acid anhydride or carboxylic anhydride is added and high-quality cleaning can therefore be performed even on an object soldered with a new solder such as lead-free solder.

Obviously many modifications and variations of the present invention are possible in the light of the above teachings. It is therefore to be understood that within the scope of the appended claims the invention may be practiced otherwise than as specifically described. The entire disclosure of Japanese Patent Application No. 2014-088461, filed on Apr. 22, 2014 including specification, claims, drawings and summary, on which the Convention priority of the present application is based, is incorporated herein by reference in its entirety.

What is claimed is:

1. A method of cleaning a mount substrate comprising the step of:

preparing an anhydrous cleaning solution that is a chemical solution produced by providing organic amine as a content in a hydrocarbon-based solvent containing at least one of a ketone, an aromatic, or a ketone and an aromatic, and by adding at least one of unsaturated carboxylic acid anhydride, carboxylic anhydride, or unsaturated carboxylic acid anhydride and carboxylic anhydride to this solvent; and cleaning the mount substrate by using the cleaning solution.

2. The method of cleaning the mount substrate according to claim 1, wherein the organic amine is at least one of a secondary organic amine, a tertiary organic amine or a secondary and a tertiary organic amine.

3. The method of cleaning the mount substrate according to claim 1, wherein the organic amine is at least one of diethanolamine, trimethylamine, or diethanolamine and trimethylamine.

4. The method of cleaning the mount substrate according to claim 1, wherein the unsaturated carboxylic acid anhydride is at least one of abietic anhydride, neoabietic anhydride, or abietic and neoabietic anhydride.

5. The method of cleaning the mount substrate according to claim 1, wherein the carboxylic anhydride is at least one of formic acid, acetic anhydride, valeric anhydride, or any combination of the three.

* * * * *